(12) United States Patent
Miranda et al.

(10) Patent No.: US 6,617,838 B1
(45) Date of Patent: Sep. 9, 2003

(54) CURRENT MEASUREMENT CIRCUIT

(75) Inventors: Evaldo M. Miranda, San Jose, CA (US); Michelle Mahony, Killarney (IE); John Cleary, Fermoy (IE); John Blake, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/952,615

(22) Filed: Sep. 11, 2001

(51) Int. Cl.[7] .................. G01R 15/08; G01R 15/12; H03K 5/1536; H03L 5/00
(52) U.S. Cl. ............... 324/117 R; 327/77; 327/308; 327/451; 324/126
(58) Field of Search ................. 324/117 R, 117 H, 324/126, 127; 327/308, 266, 246, 451, 60, 74, 77, 79

(56) References Cited

U.S. PATENT DOCUMENTS

| | | | | |
|---|---|---|---|---|
| 5,097,403 A | * | 3/1992 | Smith | 363/127 |
| 5,568,047 A | * | 10/1996 | Staver et al. | 324/127 |
| 5,872,468 A | * | 2/1999 | Dyke | 327/72 |
| 5,982,221 A | | 11/1999 | Tuthill | 327/512 |
| 6,097,239 A | | 8/2000 | Miranda, Jr. et al. | 327/512 |

* cited by examiner

Primary Examiner—Kamand Cuneo
Assistant Examiner—Emily Y Chan
(74) Attorney, Agent, or Firm—Koppel, Jacobs, Patrick & Heybl (57) ABSTRACT

The present invention is connected across a sense resistor which carries a current of interest. A first pair of cross-coupled switches are connected between the sense resistor and respective input capacitors, and a second pair of cross-coupled switches are connected between the input capacitors and the inputs of an amplifier having differential inputs and outputs. Feedback capacitors are connected between each of the amplifier's outputs and inputs. A control circuit operates the cross-coupled switches in accordance with a switching cycle, during which the connections between the sense resistor and the input capacitors are interchanged, after which the connections between the input capacitors and the differential amplifier are interchanged. When so arranged, the sensed voltage is sampled on the input capacitors and transferred to the feedback capacitors to produce a differential output voltage $V_{out}$ from the differential amplifier which is proportional to the current of interest.

11 Claims, 6 Drawing Sheets

CURRENT MEASUREMENT CIRCUIT

BACKGROUND OF THE INVENTION

1. Field of the Invention

This invention relates to the field of current sensing circuits.

2. Description of the Related Art

Current is often measured by sensing the voltage across a sensing element which carries the current of interest. To minimize losses, it is desirable to have the sensing element's resistance be as low as possible. However, this results in a small sensed voltage, which must be amplified before being used by other signal conditioning circuits such as analog-to-digital converters (ADCs).

Because the sensed voltage is so low, the amplifier's characteristics, such as its input offset voltage, have a substantial effect on the accuracy of the current measurement. Chopper amplifiers are often employed, due to their low offset voltage. However, the small sensed voltage requires the amplifier to provide a large gain, which can result in noise in the sensed voltage having a significant impact on measurement accuracy. Moreover, the amplifier's offset must be low when compared with the sensed voltage, to avoid degrading measurement accuracy.

SUMMARY OF THE INVENTION

A current measurement circuit is presented which overcomes the problems noted above, providing high accuracy current measurements for very small sensed voltages.

The measurement circuit is connected to a sensing element which carries the current of interest. The input terminals of a first pair of cross-coupled switches are connected to receive the sensed voltage, and the switches' output terminals are connected to respective input capacitors. The input capacitors' other terminals are connected to the input terminals of a second pair of cross-coupled switches, the output terminals of which are connected to the inputs of an amplifier having differential inputs and outputs. Respective feedback capacitors are connected between each of the amplifier's outputs and inputs.

A control circuit operates the cross-coupled switches in accordance with a switching cycle, during which the connections between the sensing element and the input capacitors are interchanged, after which the connections between the input capacitors and the differential amplifier are interchanged. When so operated, the sensed voltage is sampled on the input capacitors and transferred to the feedback capacitors to produce a differential output voltage $V_{out}$ from the differential amplifier. Several switching cycles are preferably performed, which causes the samples to be compounded on the feedback capacitors. This reduces the effects of noise on signal bandwidth, as well as reducing the differential amplifier's gain requirement. When so arranged, the differential output voltage $V_{out}$ is given by:

$$V_{out} = N * [(C_{in}/C_f) * 2(I*R)]$$

where N is the number of consecutively performed switching cycles (i.e., switching cycles performed without discharging the feedback capacitors), $C_{in}$ is the capacitance of the input capacitors, $C_f$ is the capacitance of the feedback capacitors, R is the resistance of the sensing element, and I is the current of interest.

Additional features include the use of a pair of switches across the feedback capacitors to auto-zero the measurement circuit, the use of an attenuation network between the sensing element and the input capacitors to reduce the common-mode voltage applied to the measurement circuit, and various means by which error due to mismatch in the attenuation network can be reduced.

Further features and advantages of the invention will be apparent to those skilled in the art from the following detailed description, taken together with the accompanying drawings.

DETAILED DESCRIPTION OF THE INVENTION

Figure 1:
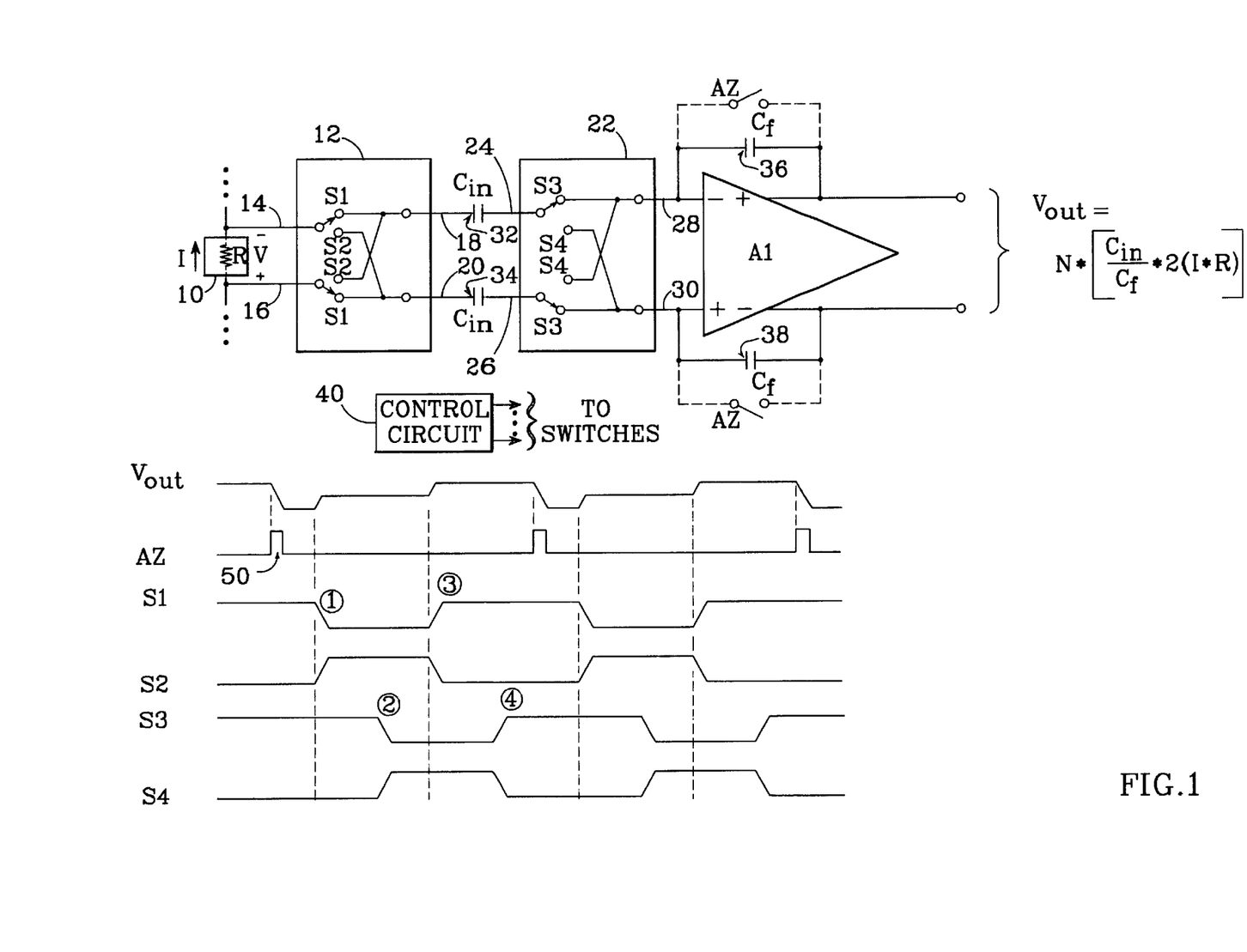
FIG. 1 is a schematic diagram and associated timing diagram for a current measurement circuit in accordance with the present invention.

A current measurement circuit in accordance with the present invention is shown in FIG. 1. A current of interest I is sensed by inserting a sensing element 10 into the current's path. Sensing element 10 is preferably a resistor which has a very low resistance R to minimize losses. The current I through resistance R develops a voltage V across the sensing element, which is given by I*R. If voltage V can be accurately determined, the current of interest I can be easily calculated using I=V/R.

When R is small, the magnitude of voltage V will also be small. In these circumstances, it is desirable to amplify V. FIG. 1 depicts a circuit for accurately amplifying a small V value. A first pair of cross-coupled switches 12 is connected across voltage V. A cross-coupled switch as used herein includes two double-pole single-throw (DPST)-equivalent switches, and has two inputs terminals and two output terminals. For cross-coupled switch 12, the DPSTs' two common terminals serve as input terminals 14 and 16. One pole from each DPST switch is connected to a respective output terminal 18 and 20, while the other pole of each switch is cross-coupled to the opposite output terminal. Cross-coupled switch 12 has two states: when in the "S1" state, input terminals 14 and 16 are connected to output terminals 18 and 20, respectively. When in the "S2" state, input terminals 14 and 16 are cross-coupled to output terminals 20 and 18, respectively.

A second pair of cross-coupled switches 22 has input terminals 24 and 26 and output terminals 28 and 30; when in the "S3" state, input terminals 24 and 26 are connected to output terminals 28 and 30, respectively, and when in the "S4" state, input terminals 24 and 26 are cross-coupled to output terminals 30 and 28, respectively.

A pair of input capacitors 32 and 34, each of which has a capacitance $C_{in}$, are connected between the first and second pairs of cross-coupled cross switches, with one input capacitor connected between output terminal 18 and input terminal 24, and the second input capacitor connected between output terminal 20 and input terminal 26.

The present measurement circuit also includes a differential amplifier A1, which has inverting and non-inverting inputs and outputs. Output terminals 28 and 30 of cross-coupled switches 22 are connected to A1's inverting and non-inverting inputs, respectively. A1's non-inverting and inverting outputs provide the current measurement circuit's differential output voltage $V_{out}$.

A first feedback capacitor 36 is connected between the non-inverting output and inverting input of A1, and a second feedback capacitor 38 is connected between A1's inverting output and non-inverting input. Each feedback capacitor has a capacitance $C_f$. The current measurement circuit also preferably includes a pair of auto-zero (AZ) switches, each of which is connected across a respective one of the feedback capacitors.

In operation, a control circuit 40 is used to operate cross-coupled switches 12 and 22 such that the voltage V across sensing element 10 is sampled on input capacitors 32 and 34, and then transferred to the feedback capacitors 36 and 38 where it is gained by the ratio of $C_{in}/C_f$. If this pattern, referred to herein as a "switching cycle", is repeated, the samples are compounded on the feedback capacitors, and the output voltage $V_{out}$ is a summation of the samples. The output voltage for each sample is given by $2(I*R)*(C_{in}/C_f)$, and thus summing multiple samples results in an output voltage $V_{out}$ given by:

$$V_{out}=N*[2(I*R)*(C_{in}/C_f)],$$

where N is the number of consecutively performed switching cycles. Compounding the samples in this way serves to reduce the effects of noise in the signal bandwidth due to noise averaging. Compounding the samples also reduces the required gain per sample.

Control circuit 40 also operates auto-zero switches AZ (if present). The operation of these switches occurs outside of the switching cycle defined above. Rather, the AZ switches are operated prior to the first of what is typically a series of two or more switching cycles.

A timing diagram illustrating the operation of the present current measurement circuit is shown in FIG. 1, with the circuit's configuration at various points in time shown in FIGS. 2–5. When auto-zero switches AZ are employed, they are momentarily closed (50) before the start of a first switching cycle. This discharges feedback capacitors 36 and 38 and makes $V_{out}$ equal to zero. Initially, cross-coupled switches 12 and 22 are as shown in FIG. 1: with switches 12 in the "S1" state and with switches 22 in the "S3" state.

Figure 2:
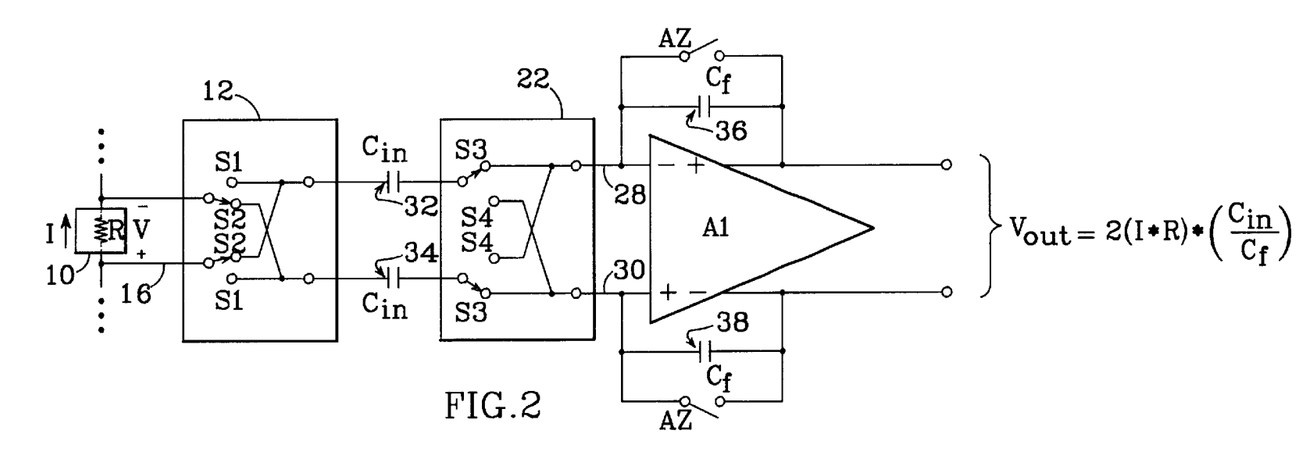
FIGS. 2–5 are schematic diagrams which depict the present current measurement circuit at various points in its switching cycle.

A first switching cycle is initiated at time "1" (indicated on the FIG. 1 timing diagram), when cross-coupled switches 12 are switched from the "S1" state to the "S2" state, so that the signals to input capacitors 32 and 34 are interchanged. This circuit configuration is illustrated in FIG. 2. Before cross-coupled switches 12 change state, each of input capacitors 32 and 34 has a voltage equal to (I*R)/2 across it, though the respective voltages are of opposite polarity. When cross-coupled switches 12 change state, a voltage equal to $I*R+(I*R)/2+(I*R)/2=2(I*R)$ is applied to amplifier A1, such that the charge on input capacitors 32 and 34 is transferred to feedback capacitors 36 and 38. As a result, after cross-coupled switches 12 change state, the output voltage $V_{out}$ becomes:

$$V_{out}(\text{FIG. 2})=2(I*R)*(C_{in}/C_f)$$

Figure 3:
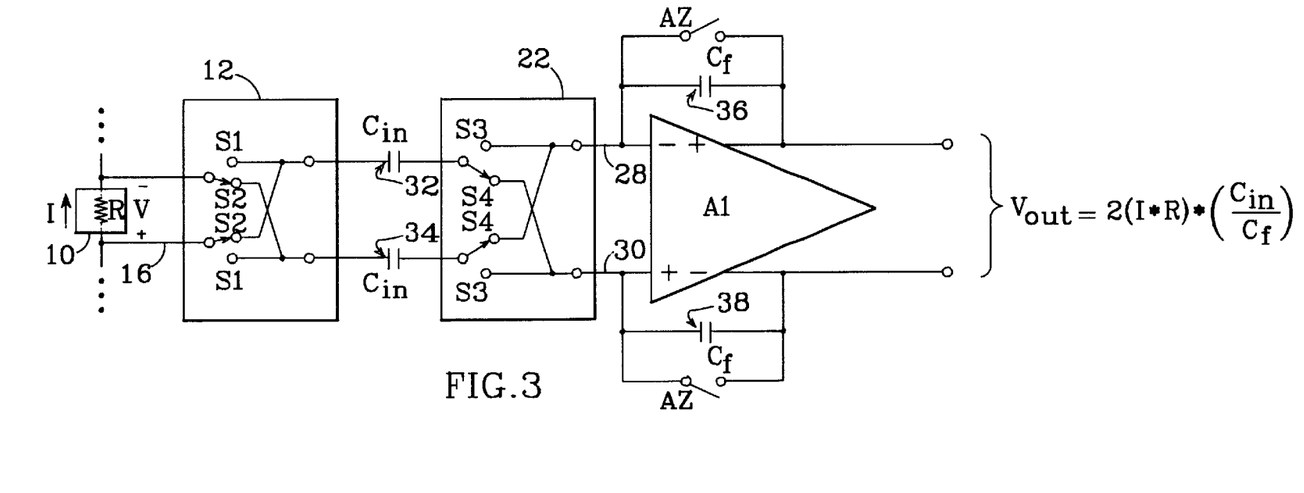

At a time "2", cross-coupled switches 22 are switched from the "S3" to the "S4" state, so that the signals presented to A1's inputs are interchanged; this configuration is shown in FIG. 3. This has no effect on $V_{out}$, because there is a virtual ground across A1's inputs; thus, $V_{out}$(FIG. 3)=$V_{out}$ (FIG. 2). However, having cross-coupled switches 22 in the "S4" position will allow the sample charge stored on input capacitors 32, 34 to be added (or compounded) to those already stored on the feedback capacitors 36, 38 when switches 12 change state at a time "3" (discussed below).

Figure 4:
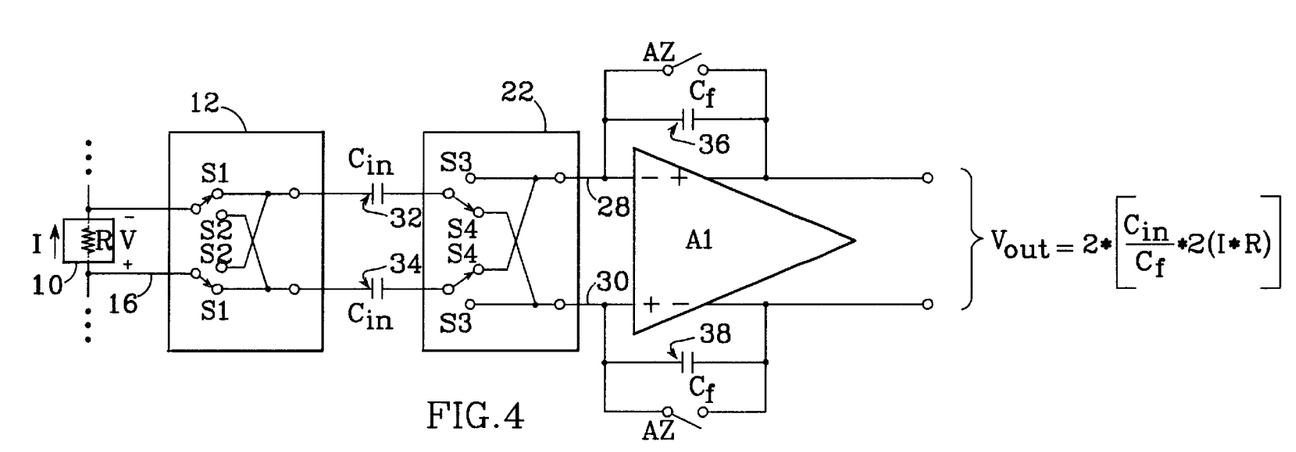

At a time "3", cross-coupled switches 12 are switched back to their "S1" state, as shown in FIG. 4. This begins a second switching cycle. The charge stored on input capacitors 32 and 34 are transferred to feedback capacitors 36 and 38, where they are compounded on the charges already stored there. This causes $V_{out}$ to increase, as follows:

$$V_{out}(\text{FIG. 4})=V_{out}(\text{FIG. 3})+[2(I*R)*(C_{in}/C_f)]$$

$$V_{out}(\text{FIG. 4})=2*[2(I*R)*(C_{in}/C_f)]$$

Figure 5:
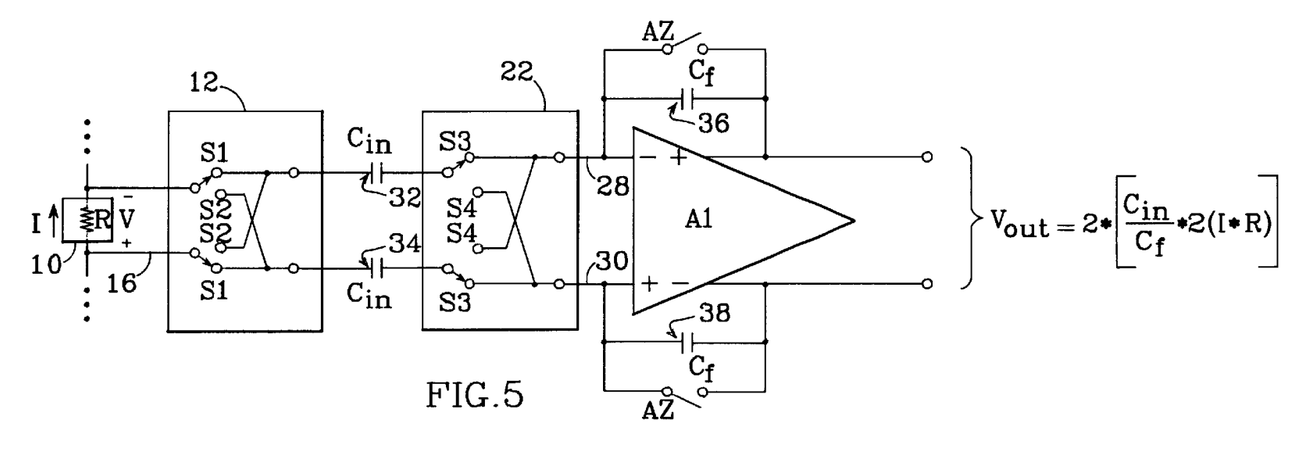

At a time "4", cross-coupled switches 22 are switched back to their "S3" state, as shown in FIG. 5. As before, the output voltage $V_{out}$ is unaffected, due to the virtual ground across A1's inputs. This completes the second switching cycle, at which point:

$$V_{out}(\text{FIG. 5})=V_{out}(\text{FIG. 4})=2*[2(I*R)*(C_{in}/C_f)]$$

If additional switching cycles are performed without toggling the AZ switches and discharging the feedback capacitors, samples will continue to be compounded and $V_{out}$ will continue to increase (up to a maximum $V_{out}$ established by A1 and its supply voltages). To generalize, the present current measurement circuit produces an output voltage $V_{out}$ which is given by:

$$V_{out}=N*[2(I*R)*(C_{in}/C_f)],$$

where N is the number of consecutively performed switching cycles performed between auto-zero operations. As noted above, compounding samples in this way enables the small voltage V across sensing element 10 to be accurately determined, while reducing the effects of noise in the signal bandwidth due to noise averaging, and reducing the required gain per sample.

Figure 6:
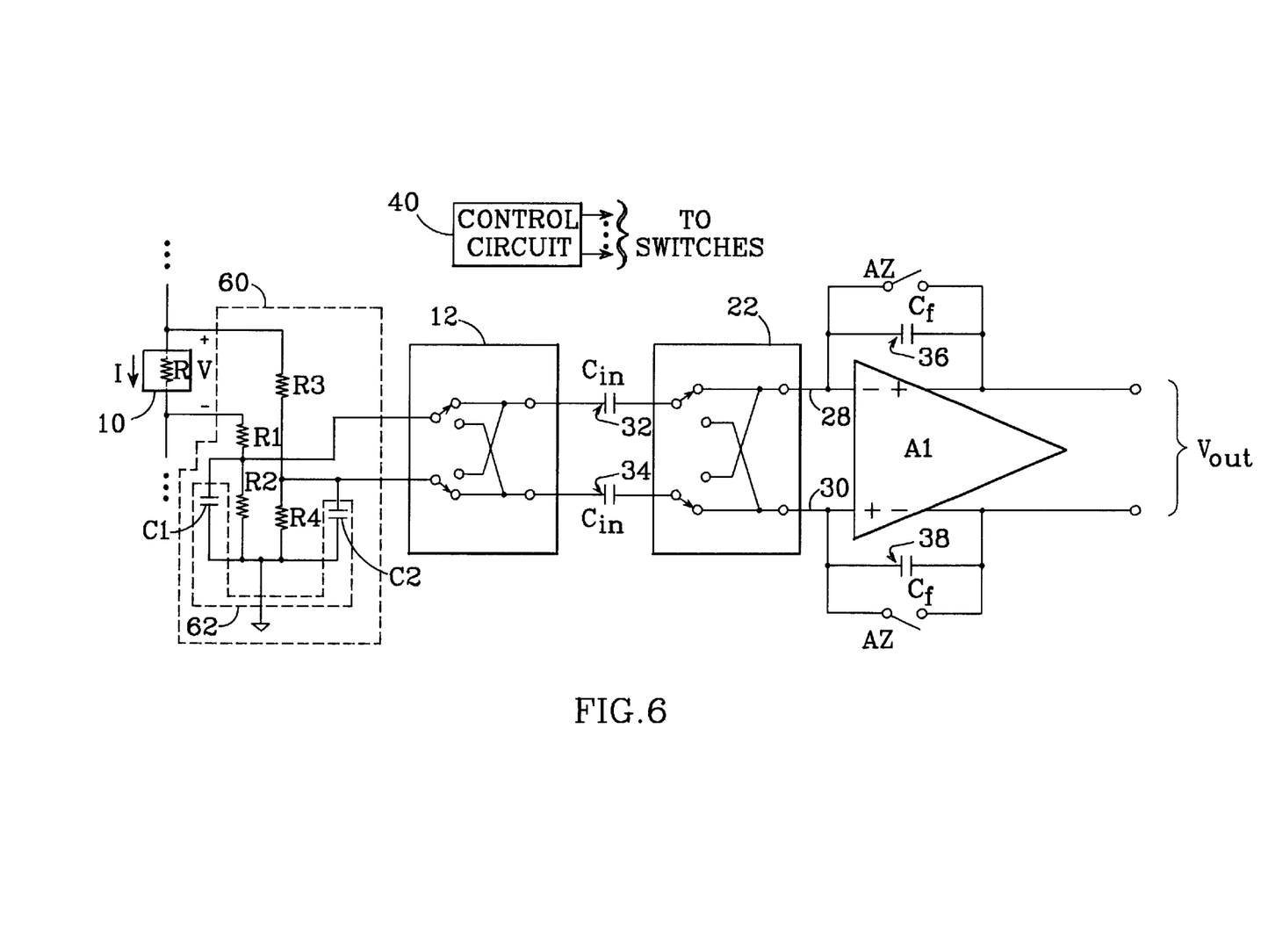
FIG. 6 is a schematic diagram of a current measurement circuit in accordance with the present invention which includes an exemplary attenuation network.

The present invention may be used to measure the current in a sensing element positioned on either the high side or the low side of a circuit. When sensing element 10 is inserted in the high side of a circuit, the signals making up voltage V may have a high common mode voltage VCM. In this case, the present current measurement circuit preferably includes an attenuation network 60 interposed between sensing element 10 and cross-coupled switches 12; such an arrangement is shown in FIG. 6. The exemplary attenuator network shown includes a first resistive divider made from a pair of resistors having resistances R1 and R2, respectively, and a second resistive divider made from a pair of resistors having resistances R3 and R4. The attenuator network is arranged to divide down VCM to a range which is acceptable to the other current measurement circuit components. Attenuator network 60 may also include a filter 62 which serves to reduce noise which may be present across sensing element 10; filter 62 is here exemplified by a pair of capacitors C1 and C2.

When the resistive dividers are matched; i.e., when the ratio of R1 to R2 is equal to the ratio of R3 to R4, output voltage $V_{out}$ is reduced by the factor R2/(R1+R2), such that:

$$V_{out}=[R2/(R1+R2)]*N*[2(I*R)*(C_{in}/C_f)].$$

If an attenuation network 60 is employed, an inaccuracy in $V_{out}$ may arise if the resistive dividers are mismatched; i.e., if R1/R2≠R3/R4. When this occurs, $V_{out}$ is given by:

$$V_{out}=[R2/(R1+R2)]*N*[2(I*R)*(C_{in}/C_f)] \pm [R2/(R1+R2)-R4/(R3+R4)]*[N*(C_{in}/C_f)]*VCM.$$

Figure 7:
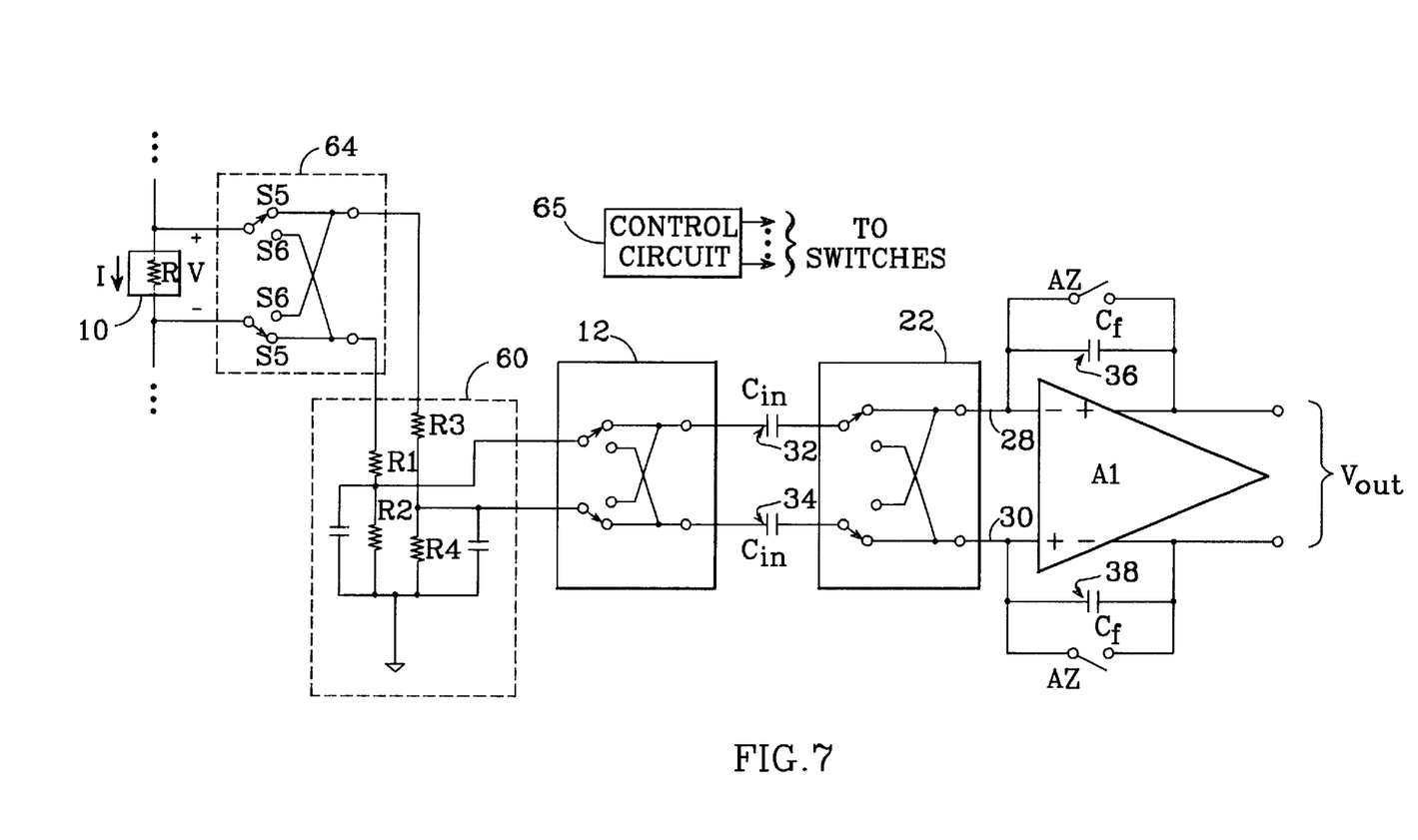
FIG. 7 is a schematic diagram of a current measurement circuit in accordance with the present invention which includes a pair of cross-coupled switches to remedy attenuator mismatch.

One possible remedy for this inaccuracy is shown in FIG. 7. Here, a third pair of cross-coupled switches 64 is connected between sensing element 10 and attenuator network 60; a control circuit 65 is arranged to operate switches 64 as described below, along with switches 12, 22 and AZ as described previously. Switches 64 have "S5" and "S6" states; they are operated such that they are in the "S5" state during one switching cycle, and in the "S6" state during the next switching cycle. In this way, the error due to attenuator mismatch is alternately added to and subtracted from $V_{out}$. If the number N of switching cycles is an even number, error due to attenuator mismatch is virtually eliminated with this technique.

A second remedy is to make divider resistors R2 and R4 variable, and adjusting these variable resistors as necessary to null out the attenuator mismatch.

A third alternative is to place cross-coupled switches 64 in the "S5" state for a number of switching cycles X, during which a first output voltage $V_{out1}$ is produced, and then placed in the "S6" state for X switching cycles to produce an output voltage $V_{out2}$, with $V_{out}$ determined by calculating the average of $V_{out1}$ and $V_{out2}$.

Figure 8:
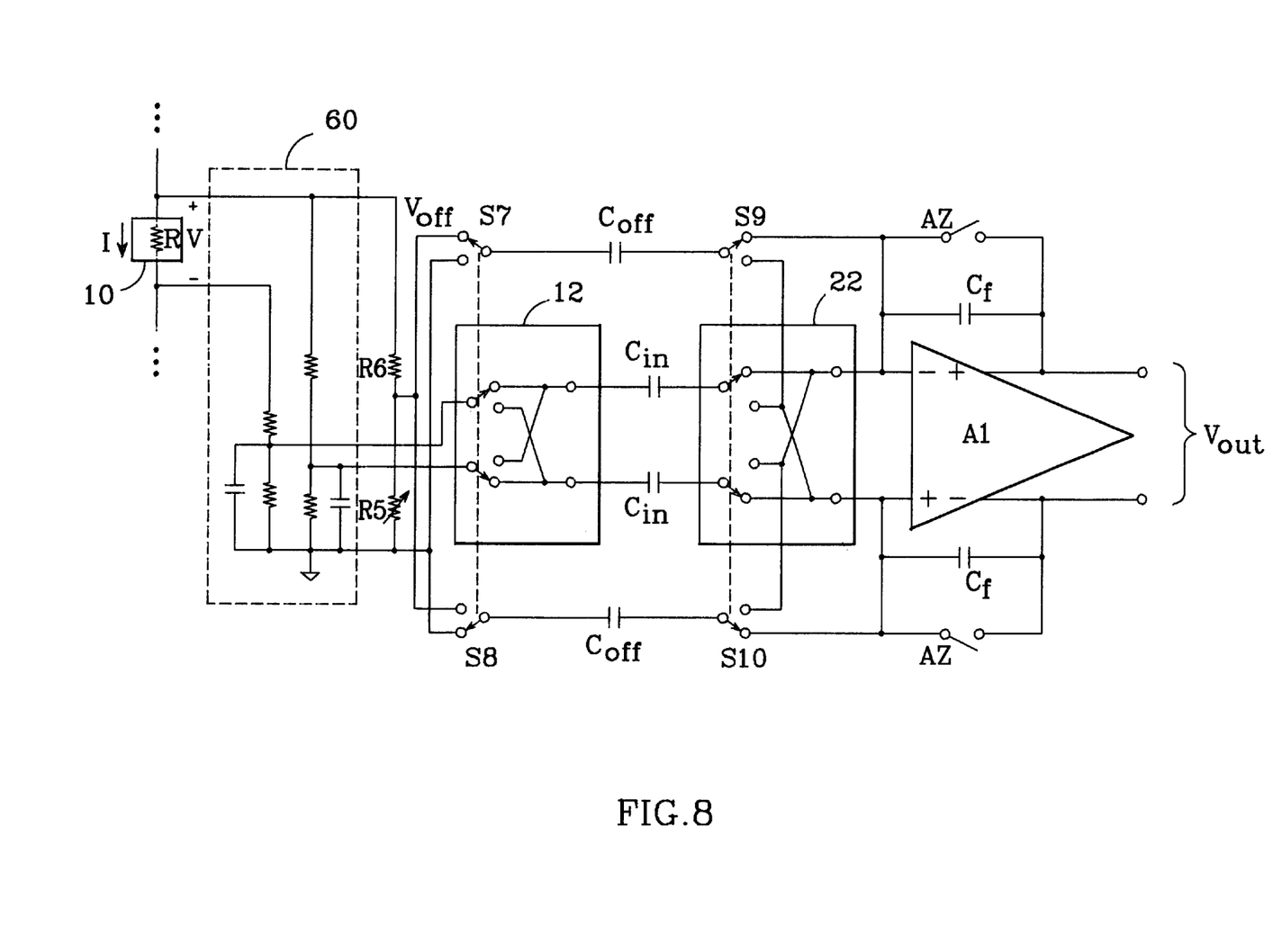
FIG. 8 is a schematic diagram of a current measurement circuit in accordance with the present invention which includes an exemplary current offset circuit to remedy attenuator mismatch.

Another possible remedy for attenuator mismatch is illustrated in FIG. 8, in which an offset voltage $V_{off}$ is derived from common mode voltage VCM, and is added to or subtracted from $V_{out}$ to correct for the mismatch error. In the exemplary implementation shown in FIG. 8, a resistive divider made from a pair of resistors having resistances R5 and R6 (at least one of which is preferably variable) is connected to divide down VCM; the divider output is $V_{off}$, which is given by:

$$V_{off}=[R5/(R5+R6)]*VCM.$$

$V_{off}$ is connected to one pole of a pair of DPST switches S7 and S8, with the other pole of each switch connected to a circuit common point and the common terminals of each switch connected to respective offset capacitors, each of which has a capacitance $C_{off}$. S7 and S8 are arranged to move synchronously with cross-coupled switches 12. The offset capacitors' other terminals are connected to a pair of DPST switches S9 and S10 which move synchronously with cross-coupled switches 22, and are arranged to transfer the charge stored on the offset capacitors to A1's feedback capacitors. When arranged as shown in FIG. 8, a correction term given by:

$$[R5/(R5+R6)]*VCM*N*(C_{off}/C_f)$$

can be added to or subtracted from $V_{out}$. The term is subtracted from $V_{out}$ by having switches S7 and S8 initially positioned as shown in FIG. 8. To add the correction term to $V_{out}$, switches S7 and S8 should initially be flipped into their other position.

Note that there are numerous other ways in which an offset voltage could be added to or subtracted from $V_{out}$ to correct for attenuator mismatch. For example, a fixed offset voltage could be used instead of an offset voltage which varies with VCM.

There are a number of ways in which the cross-coupled switches employed herein may be implemented. For example, each DPST switch may actually comprise two SPST switches, each of which may be implemented with, for example, a FET transistor. When so arranged, cross-coupled switches 22 (and switches S9 and S10 if present) should be operated on a break-before-make basis, to avoid the possibility of the charge on one or both of the input capacitors being split between the switch's two output terminals.

Amplifier A1 may be a chopper amplifier, which periodically swaps its inputs internally to cancel any amplifier offset voltages. In this case, the current measurement circuit's samples should be interspersed with the chopping cycle; this process is described in detail in U.S. Pat. No. 6,097,239.

While particular embodiments of the invention have been shown and described, numerous variations and alternate embodiments will occur to those skilled in the art. Accordingly, it is intended that the invention be limited only in terms of the appended claims.

We claim:

1. A current measurement circuit, comprising:
   a sensing element having a resistance R which carries a current I and develops a voltage V across it which varies with I*R,
   a first pair of cross-coupled switches which have respective input terminals and output terminals and which are operated with respective control signals, said input terminals connected to receive a voltage representative of said voltage V,
   a second pair of cross-coupled switches which have respective input terminals and output terminals and which are operated with respective control signals,
   a pair of input capacitors, each of which has a capacitance $C_{in}$ and is connected between a respective one of said output terminals of said first pair of cross-coupled switches and a respective one of said input terminals of said second pair of cross-coupled switches,
   a differential amplifier having inverting and non-inverting inputs and outputs, said inverting and non-inverting inputs connected to respective ones of said output terminals of said second pair of cross-coupled switches,
   a pair of feedback capacitors, each of which has a capacitance $C_f$, one of which is connected between the inverting output and non-inverting input of said differential amplifier and the other of which is connected between the non-inverting output and inverting input of said differential amplifier, and
   a control circuit connected to provide said control signals to said first and second pair of cross-coupled switches and arranged to operate said first and second pair of cross-coupled switches in accordance with a switching cycle during which the connections between said first pair of cross-coupled switches and said input capacitors are interchanged, after which the connections between said second pair of cross-coupled switches and said differential amplifier's inputs are interchanged, such that said voltage representative of said voltage V is sampled on said input capacitors and transferred to said feedback capacitors to produce a differential output voltage $V_{out}$ from said differential amplifier given by:

$$V_{out}=N*[(C_{in}/C_f)*2(I*R)]$$

where N is the number of consecutively performed switching cycles.

2. The current measurement circuit of claim 1, wherein said sensing element is a resistor.

3. The current measurement circuit of claim 1, further comprising an attenuation network connected to receive said voltage V at an input and which attenuates said voltage V by a factor Z and provides said attenuated voltage at an output to the input terminals of said first pair of cross-coupled switches, such that said differential output voltage $V_{out}$ is given by:

$$V_{out} = Z*N*[(C_{in}/C_f)*2(I*R)].$$

4. The current measurement circuit of claim 3, further comprising a third pair of cross-coupled switches connected between said sensing element and said attenuation network and which are operated with respective control signals, said control circuit connected to provide said control signals to said third pair of cross-coupled switches and further arranged to operate said third pair of cross-coupled switches such that the connections between said sensing element and said attenuation network are periodically interchanged to reduce current measurement error due to attenuator mismatch.

5. The current measurement circuit of claim 3, further comprising a filter connected to said attenuation network and arranged to attenuate noise which may be present on voltage V.

6. The current measurement circuit of claim 3, wherein one terminal of said sensing element is at a common mode voltage VCM, further comprising:
   a voltage divider connected between one side of said sensing element and a ground potential and which attenuates said common mode voltage VCM by a factor X, said attenuated voltage being an offset voltage,
   a pair of offset capacitors, each of which has a capacitance $C_{off}$,
   a third pair of switches which are operated with respective control signals and which are operated with said first pair of cross-coupled switches to alternatingly connect respective ones of said offset capacitors between said offset voltage and said circuit common point, and
   a fourth pair of switches which are operated with respective control signals and which are operated with said second pair of cross-coupled switches to alternatingly connect respective ones of said offset capacitors between said amplifier's inverting and non-inverting inputs,
   said control circuit connected to provide said control signals to said third and fourth pair of cross-coupled switches and arranged to operate said third and fourth pair of switches to produce a correction term given by $X*VCM*N*(C_{off}/C_f)$ which can be added to or subtracted from $V_{out}$ to correct for attenuator mismatch.

7. The current measurement circuit of claim 1, further comprising a pair of auto-zero switches which are operated with respective control signals and which are connected across respective ones of said feedback capacitors, said control circuit connected to provide said control signals to said auto-zero switches and further arranged to operate said pair of auto-zero switches to initially discharge said feedback capacitors prior to initiating a first switching cycle.

8. The current measurement circuit of claim 1, wherein said differential amplifier is a chopper amplifier.

9. The current measurement circuit of claim 1, wherein each of said pairs of cross-coupled switches comprises two pairs of transistors, the transistors of each of said pairs connected to form a respective double-pole single-throw (DPST) switch.

10. A high side current measurement circuit, comprising:
   a sense resistor having a resistance R which carries a current I and develops a voltage V across it which varies with I,
   an attenuation network which attenuates said voltage V by a factor Z and provides the attenuated voltage at a pair of outputs,
   a first pair of cross-coupled switches which have respective input terminals and output terminals and which are operated with respective control signals, said input terminals connected to receive said attenuated voltage,
   a second pair of cross-coupled switches which have respective input terminals and output terminals and which are operated with respective control signals,
   a pair of input capacitors, each of which has a capacitance $C_{in}$ and is connected between a respective one of said output terminals of said first pair of cross-coupled switches and a respective one of said input terminals of said second pair of cross-coupled switches,
   a differential amplifier having inverting and non-inverting inputs and outputs, said inverting and non-inverting inputs connected to respective ones of said output terminals of said second pair of cross-coupled switches,
   a pair of feedback capacitors, each of which has a capacitance $C_f$, one of which is connected between the inverting output and non-inverting input of said differential amplifier and the other of which is connected between the non-inverting output and inverting input of said differential amplifier,
   a pair of auto-zero switches which are connected across respective ones of said feedback capacitors and which are operated with respective control signals, and
   a control circuit connected to provide said control signals to said first and second pair of cross-coupled switches and said pair of auto-zero switches and arranged to operate said first and second pair of cross-coupled switches in accordance with a switching cycle during which the connections between said first pair of cross-coupled switches and said input capacitors are interchanged, after which the connections between said second pair of cross-coupled switches and said differential amplifier's inputs are interchanged, such that said attenuated voltage is sampled on said input capacitors and transferred to said feedback capacitors to produce a differential output voltage $V_{out}$ from said differential amplifier given by:

$$V_{out} = Z*N*[(C_{in}/C_f)*2(I*R)]$$

where N is the number of consecutively performed switching cycles, said control circuit further arranged to operate said pair of auto-zero switches to initially discharge said feedback capacitors prior to initiating a first switching cycle.

11. The current measurement circuit of claim 10, wherein one terminal of said sense resistor is at a common mode voltage VCM, further comprising:
   a voltage divider connected between one side of said sensing element and a ground potential and which attenuates said common mode voltage VCM by a factor X, said attenuated voltage being an offset voltage,
   a pair of offset capacitors having a capacitance $C_{off}$,
   a third pair of switches which are operated with respective control signals and which are operated with said first pair of cross-coupled switches to alternatingly connect respective ones of said offset capacitors between said offset voltage and said circuit common point, and
   a fourth pair of switches which are operated with respective control signals and which are operated with said second pair of cross-coupled switches to alternatingly connect respective ones of said offset capacitors between said amplifier's inverting and non-inverting inputs, said control circuit connected to provide said control signals to said third and fourth pair of cross-coupled switches and further arranged to operate said third and fourth pair of switches to produce a correction term given by $X*VCM*N*(C_{off}/C_f)$ which can be added to or subtracted from $V_{out}$ to correct for attenuator mismatch.

* * * * *